United States Patent
De Schepper et al.

(10) Patent No.: US 9,520,298 B2
(45) Date of Patent: Dec. 13, 2016

(54) PLASMA METHOD FOR REDUCING POST-LITHOGRAPHY LINE WIDTH ROUGHNESS

(71) Applicants: IMEC VZW, Leuven (BE); Katholieke Universiteit Leuven, KU LEUVEN R&D, Leuven (BE)

(72) Inventors: Peter De Schepper, Hoboken (BE); Jean-Francois de Marneffe, Gottechain (BE); Efrain Altamirano Sanchez, Kessel-lo (BE)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 14/616,672

(22) Filed: Feb. 7, 2015

(65) Prior Publication Data

US 2015/0228497 A1    Aug. 13, 2015

(30) Foreign Application Priority Data

Feb. 7, 2014    (EP) .................................. 14154283

(51) Int. Cl.
  *H01L 21/308*    (2006.01)
  *H01L 21/3065*    (2006.01)
  *H01L 21/027*    (2006.01)

(52) U.S. Cl.
  CPC ....... *H01L 21/3086* (2013.01); *H01L 21/0273* (2013.01)

(58) Field of Classification Search
  USPC .............................................. 216/67; 438/710
  See application file for complete search history.

(56) References Cited

U.S. PATENT DOCUMENTS

| 6,365,325 B1 * | 4/2002 | Chiang | G03F 7/40 430/313 |
| 7,084,070 B1 * | 8/2006 | Lee | H01L 21/31111 134/1.1 |
| 8,298,958 B2 * | 10/2012 | Adams | H01J 37/321 438/717 |
| 2005/0161434 A1 * | 7/2005 | Sugawara | H01L 21/3105 216/67 |
| 2007/0207404 A1 * | 9/2007 | Shen | G03F 7/168 430/270.1 |

(Continued)

OTHER PUBLICATIONS

Schuppert, B. et al., "Anisotropic Plasma Etching of Polymers Using a Cryo-Cooled Resist Mask", Journal of Vacuum Science and Technology, vol. 18(2), Mar./Apr. 2000, pp. 385-387.

(Continued)

*Primary Examiner* — Shamim Ahmed
(74) *Attorney, Agent, or Firm* — McDonnell Boehnen Hulbert & Berghoff LLP

(57) ABSTRACT

The present disclosure is related to a method for treating a photoresist structure on a substrate, the method comprising producing one or more resist structures on a substrate, introducing the substrate in a plasma reactor, and subjecting the substrate to a plasma treatment at a temperature lower than zero degrees Celsius, such as between zero and −110° C. The plasma treatment may be a $H_2$ plasma treatment performed in an inductively coupled plasma reactor. The treatment time may be at least 30s.

17 Claims, 4 Drawing Sheets

(56) References Cited

U.S. PATENT DOCUMENTS

| | | | |
|---|---|---|---|
| 2008/0182419 A1 | 7/2008 | Yasui et al. | |
| 2010/0330503 A1* | 12/2010 | Bae | G03F 7/0035 430/312 |
| 2011/0117749 A1* | 5/2011 | Sheu | H01J 37/32091 438/735 |
| 2012/0223418 A1* | 9/2012 | Stowers | C23C 18/06 257/632 |
| 2013/0011630 A1* | 1/2013 | Sullivan | C08G 77/58 428/195.1 |
| 2013/0267097 A1* | 10/2013 | Srivastava | G03F 7/40 438/710 |
| 2015/0118863 A1* | 4/2015 | Rathod | C23C 16/045 438/778 |
| 2015/0132971 A1* | 5/2015 | Lin | H01L 21/0273 438/725 |
| 2015/0155305 A1* | 6/2015 | Wu | H01L 27/124 257/72 |

OTHER PUBLICATIONS

Wu, Y. et al., "Cryogenic Etching of Nano-Scale Silicon Trenches With Resist Masks", Microelectronic Engineering, vol. 88, 2011, pp. 2785-2789.

De Schepper, Peter et al., "Line Edge and Width Roughness Smoothing by Plasma Treatment", Proc. SPIE, vol. 8685, Advanced Etch Technology for Nanopatterning II, Mar. 29, 2013, 868508-1-868508-8.

Altamirano-Sanchez, Efrain et al., "Dry Etching Challenges for Patterning Smooth Lines: LWR Reduction of Extreme Ultra Violet Photo Resist", Advanced Etch Technology for Nanopatterning, Proc. of SPIE, vol. 8328, 2012, pp. 83280L-1-83280L-9.

De Schepper, Peter et al., "Line Edge and Width Roughness Smoothing by Plasma Treatment", SPIE Journal of Micro/Nanolithography, MEMS, and MOEMS, Apr.-Jun. 2014, vol. 13(2), 023006-1-023006-8.

* cited by examiner

PLASMA METHOD FOR REDUCING POST-LITHOGRAPHY LINE WIDTH ROUGHNESS

CROSS-REFERENCE TO RELATED APPLICATION

This application claims priority to European Patent Application No. 14154283.7 filed on Feb. 7, 2014, the contents of which are hereby incorporated by reference.

FIELD OF THE DISCLOSURE

The present disclosure is related to lithography of organic substrates, in particular semiconductor substrates. The disclosure is in particular related to a method for reducing the line width roughness of photoresist structures without a substantial shift in the critical dimension of such structures.

STATE OF THE ART

Lithography is used to develop various structures onto an organic substrate. In particular, lithography is used to produce line structures on a semiconductor substrate, for example for the production of fin-type field effect transistors (FINFETs). The manufacturing of sub-30 nm technologies using extreme UV lithography (EUV) has triggered a drastic change in photoresist-materials. 'Extreme UV lithography' is the name given to the lithography technology, using an extreme ultraviolet wavelength, with a typical value of 13.5 nm, and that allows the sub-30 nm manufacturing to be performed. This technology faces many challenges, such as controlling the variation of the critical dimension (CD) of the structures.

For a line structure, the CD is defined as the width of the lines. This variation of the line width is expressed by the so-called 'line width roughness' value (LWR), most often defined as the 3sigma ($3\sigma$) value of the difference between the theoretical CD and the measured CD on a number of positions along a line. The variation of the edges of the line with respect to the ideal case is called the 'line edge roughness' (LER) and is defined for both the left and right edge (equally usually defined as a $3\sigma$ value of measured positions with respect to a reference level).

FIG. 1 illustrates the meaning of these terms, as seen in a view of a line structure having an 'ideal' critical dimension CD, and comparing the 'ideal case' with the 'real case'. In optical lithography, the LER of two edges can be considered as uncorrelated. However, LER and LWR are correlated by the relation: LWR=$2^{1/2}$ LER. In this way, LWR and LER are not independent from each other; when LER decreases, LWR decreases as well.

The challenge referred to above is further explained on the basis of FIG. 2. The standard lithography steps are illustrated. On a substrate 1, a resist layer 2 is deposited. Substrate 1 can be bulk silicon, onto which a sequence of different materials with various purposes (such as hard mask and anti-reflective coating) have been deposited through PVD, CVD, ALD, or spin-coating, but not restricted to these examples. The resist layer 2 is exposed to a light source through a mask, to thereby produce a pattern which can form parallel resist lines 3 after development. Using the resist lines 3 as a mask, the line pattern is then transferred into the underlying materials, through various etch processes, to obtain the line structures 4 fabricated in the material. One potential issue is that the roughness of the patterned resist lines 3 may be transferred into the underlying substrate during the etch processes using the resist as an etch mask. The transfer of LWR into the final substrate is important with respect to the device behaviour when these structures are further processed into micro-electronic components. The best LWR that currently can be achieved with EUV lithography is about 3 to 4 nm for the 30 nm lines (referring to the line width). Nevertheless, an improvement in LWR with a factor of two is desired in order to meet the requirements for 14 nm lines and beyond.

Photoresist materials that are suitable for EUV lithography can be categorized into two families of which polystyrene (PS) and polymethylmethacrylate (PMMA) are the main backbone structures. Different functional groups may be attached to this backbone in order to modify both chemical and physical properties, for example, to obtain increased etch resistivity and/or increased glass transition temperature $T_g$. Common PMMA polymers have a "low" $T_g$ reaching 100° C.-120° C. This temperature can be changed by adding cyclic or even more robust adamantyl side groups to the polymer chain. Together with these functional groups also a photo acid generator (PAG) and quencher may be added to increase the performance of the resist.

De Schepper et al. ("Line edge and width roughness smoothing by plasma treatment", Proc. SPIE, vol. 8685, pp. 868507, 2013) has evaluated the influence of different plasma treatments onto two types of EUV resists. The outcome of this research resulted in a decrease of LWR after $H_2$ plasma treatment at room temperature.

In the latter study also the chemical modifications were monitored. Chemical characterization pre- and post-plasma treatment mainly indicates the depletion of the functional side groups. The depletion of these groups changes the polymer characteristics. By depleting the functional groups, the glass transition temperature is changed. The depletion of the side groups is caused mainly by the VUV (vacuum UV) irradiation of the plasma. By changing the glass transition temperature, the plasma treatment at room temperature as well as the ion bombardment can locally increase the resist surface temperature above its glass transition temperature, causing a higher polymer mobility.

Increased polymer chain mobility makes it possible to "cover up" roughness on all feature areas. However, a major drawback of this resist reflow is the loss of resist profile, which manifests itself by an excessive increase of the critical dimension.

SUMMARY OF THE DISCLOSURE

The disclosure is related to a method as disclosed in the appended claims and discussed herein. In one example, a method for treating a photoresist structure on a substrate includes producing one or more resist structures on a substrate, introducing the substrate in a plasma reactor, and subjecting the substrate to a plasma treatment at a temperature lower than zero degrees Celsius.

According to one embodiment, the resist structure is a high resolution photoresist. The photoresist may comprise a polymer backbone structure with or without functional groups.

In the method of the disclosure, the photoresist structures may be parallel resist lines and the critical dimension of the lines may be lower than or equal to 30 nm.

The plasma treatment is an $H_2$ plasma treatment in one example. According to an embodiment, the plasma treatment takes place at a temperature between zero and −110° C., or between −10° C. and −100° C. In one example, the duration of the plasma treatment is higher than 30 s, such as between 30 s and 180 s. The pressure during the plasma treatment may be between 2 and 50 mTorr.

In the method of the disclosure, the substrate may consist of or comprise a semiconductor wafer or at least a semiconductor layer.

The plasma treatment may be followed by a plasma etching process that uses the resist pattern as a mask.

According to an embodiment, the substrate is cooled to a temperature lower than zero degrees Celsius. For instance, the substrate may be mounted on a cooled substrate chuck. This may be chuck cooled by a cooling circuit, e.g., using helium as a cooling medium.

According to one embodiment, the plasma reactor is an inductively coupled plasma reactor comprising a cylindrical coil, and a plasma is produced in an area substantially defined by the interior of the coil. The distance between the core of the plasma and the upper surface of the substrate may be between 15 cm and 25 cm.

According to an embodiment, the plasma reactor is a Transformer Coupled Plasma reactor comprising a planar coil and a reaction window, and wherein a plasma is produced in an area between the reaction window and the upper surface of the substrate. According to an embodiment, the distance between the core of the plasma and the upper surface of the substrate is between 2 cm and 7 cm.

According to one embodiment, the method of the disclosure produces shrinkage of the critical dimension of the photoresist structures between 0% and 10%, such as between 2% and 8%, and a reduction of the Line Width Roughness of at least 7%, for example.

DETAILED DESCRIPTION OF THE DISCLOSURE

The present disclosure is related generally to a method for treating a resist structure located on a substrate, by a plasma treatment, wherein the surface roughness of the resist structure may be significantly decreased, without causing any substantial loss in the critical dimension of the structure. The method, in one example, includes producing one or more resist structures on a substrate, introducing the substrate in a plasma reactor, and subjecting the substrate to a plasma treatment at a temperature lower than zero degrees Celsius, such as at a temperature between zero and −110° C. According to a specific embodiment, the temperature is between −10° C. and −100° C. According to a more specific embodiment, the temperature is between −10° C. and −30° C.

Figure 1:
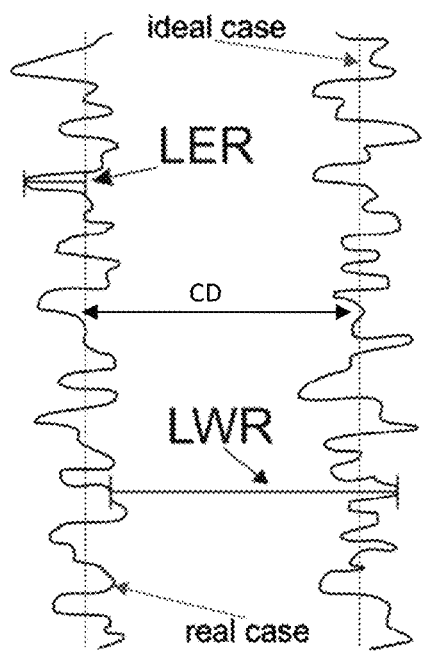
FIG. 1 shows a line structure to illustrate the meaning of the terms LWR and LER according to one embodiment.
Figure 2:
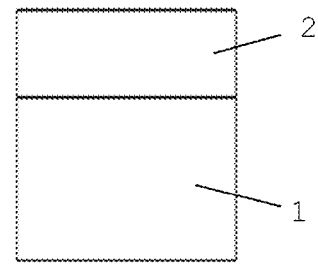
FIG. 2 is a block diagram illustrating basic lithography steps according to one embodiment.
Figure 2:
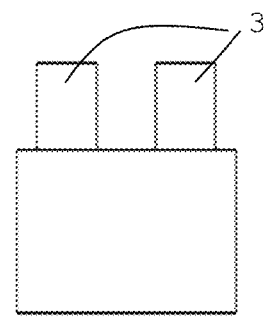
Figure 2:
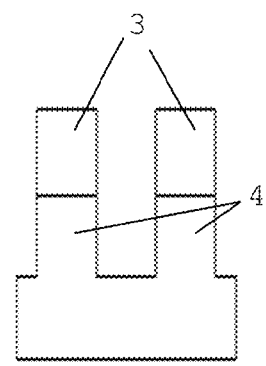
Figure 2:
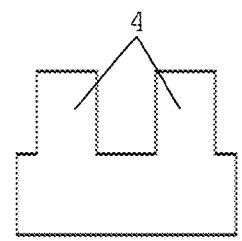

The resist structures can be parallel lines arranged in an array of lines, as illustrated in FIG. 2. In one example, the width of the lines is lower than 30 nm.

The resist structure may be formed of a resist type that is referred to within the context of this description as a high resolution resist. This denomination is defined as comprising all resist types suitable for fabrication of structures in the 30 nm node or less.

Primary examples of such a resist type are the resist types described in the introductory paragraph, e.g., comprising Polystyrene (PS) and polymethylmethacrylate (PMMA) as the main backbone structures, and provided with functional groups.

The plasma treatment is the exposure of the substrate and resist structure to a plasma discharge with high VUV flux and low ion energy, for example but not limited to, a $H_2$ based plasma ignited in an ICP (Inductively Coupled Plasma) chamber geometry. In one example, the plasma treatment takes place at low pressure, such as in the range between 2 mTorr and 50 mTorr, e.g., at 10 mTorr.

Figure 3A:
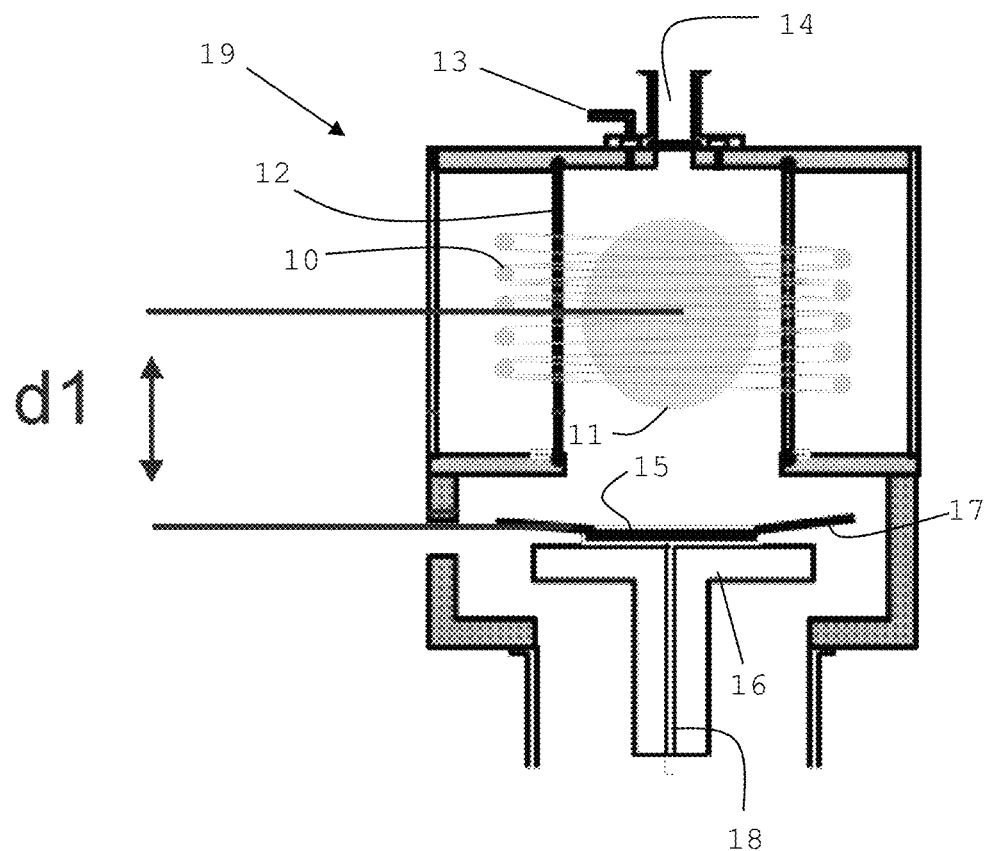
FIGS. 3a and 3B are diagrammatic views of two plasma reactors in which the method of the disclosure can be applied according to one embodiment.

An example plasma geometry is illustrated in FIG. 3a. This is an ICP reactor 19 comprising a cylindrical water cooled ICP coil 10 coupled to an RF power source (not shown) and a ceramic ICP tube 12. Furthermore, a gas inlet 13 and spectroscopy window 14 are shown. A substrate 15 is clamped onto a wafer chuck 16 by a clamping mechanism 17. The chuck may be coupled to an RF power source (not shown) of the same frequency as the RF power source coupled to the ICP coil 10. However, during the plasma treatment according to the disclosure, the chuck may not be powered. The chuck may be powered during subsequent etching.

The chuck is provided with a cooling circuit (symbolically illustrated by tube 18) for controlling the temperature of the substrate during plasma treatment. The coolant used can be liquid nitrogen, which facilitates the control of the substrate temperature within the above-described ranges below zero ° C. In the method of the disclosure that utilizes the geometry of FIG. 3a, the plasma 11 is produced in an area substantially defined by the interior of the coil 10. The distance $d_1$ from the core of the plasma (situated at generally the center of the coil 10) to the upper surface of the substrate is preferably between 15 cm and 25 cm.

Figure 3B:
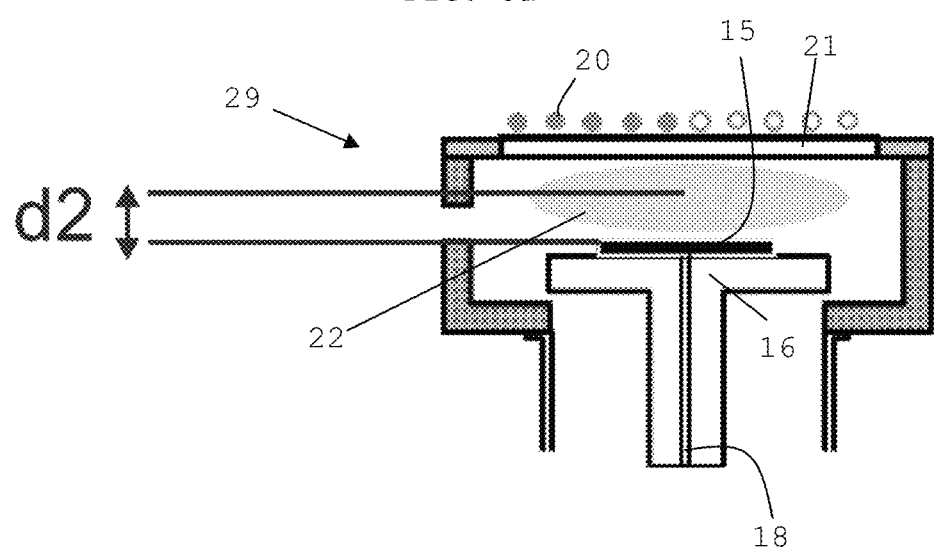

Another type of inductively coupled plasma reactor in which the method of the disclosure can be applied is a Transformer Coupled Plasma (TCP) reactor 29, illustrated in FIG. 3b. In this type of reactor a planar inductive coil 20 is mounted on a dielectric window 21. The plasma 22 is created in the area between the window 21 and a substrate 15 mounted on a chuck 16. The distance $d_2$ between the core of the plasma and the upper substrate surface in this type of reactor is lower than in a reactor of the type shown in FIG. 3a. Distance $d_2$ may be between 2 cm and 7 cm. The chuck 16 can again be cooled through a cooling circuit 18, to apply the plasma treatment at the low temperatures (<0° C.) given above. Again, the chuck 16 may be connected to an RF source, but, in one example, the chuck is not powered during the plasma treatment according to the disclosure, whereas the chuck may be powered during subsequent etching.

The duration of the plasma treatment is higher than 30 s, in one example. According to specific embodiments, the duration may be between 30 s and 180 s, or between 30 s and 90 s, or between 45 s and 75 s. Any combination of the temperature ranges and the treatment time ranges disclosed in this description is applicable in the method of the disclosure.

Under the conditions defined by the present disclosure, the plasma treatment may cause either one of the following phenomena to take place, depending on the choice of parameters in terms of the type of resist, the plasma temperature, the plasma treatment duration and/or other parameters. One phenomenon is a 'shrinkage' of the CD, without visible reflow, together with a significant reduction of the LWR value. Without being bound to theory, the CD-shrinkage is believed to be due to a loss of functional groups under the influence of the plasma, allowing the polymer chains to re-arrange and become more dense. CD shrinkage has been reported in the above-cited reference by De Schepper et al, but not in combination with an improvement of LWR. CD shrinkage as defined hereinabove and illustrated by the examples given further in this application do not represent a 'substantial loss' in the critical dimension.

Figure 4:
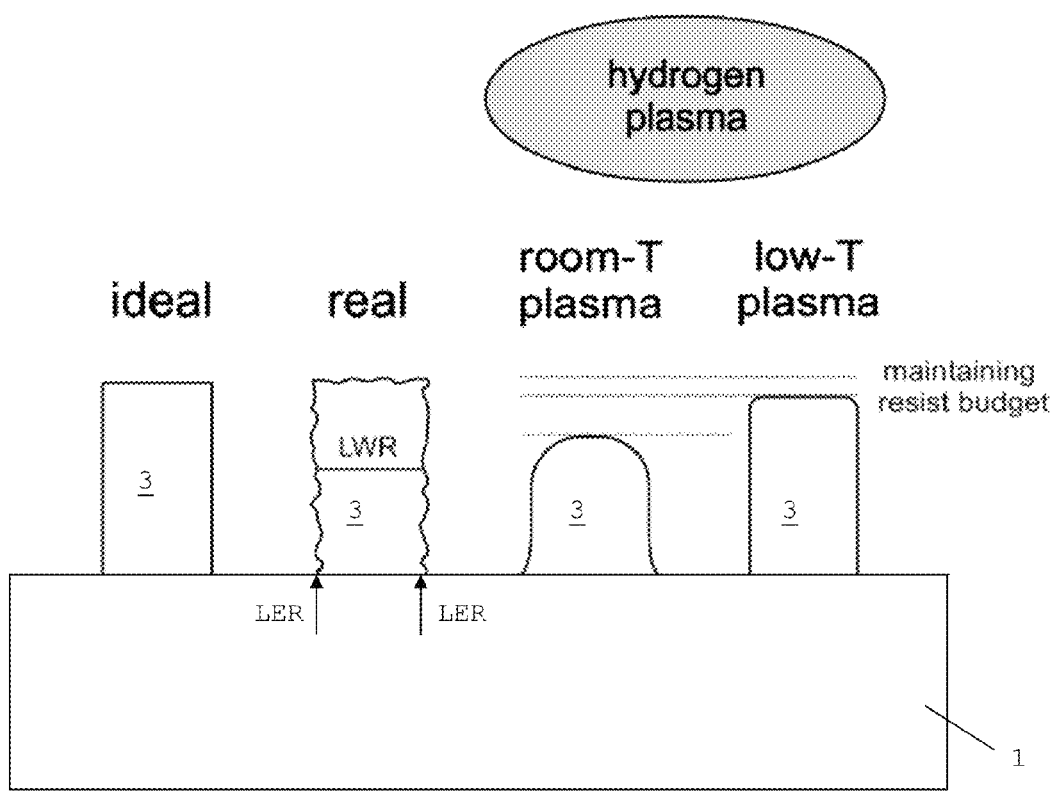
FIG. 4 is a block diagram illustrating the difference between excessive resist reflow observed under conventional conditions, and limited resist reflow observed under conditions described in the present disclosure.

Another phenomenon is a reflow of the resist material, smoothening the resist surface, but wherein the reflow is limited to a very thin layer at the surface of the resist structure. In this way, the critical dimension of the structure is maintained or only marginally increased. FIG. 4 illustrates the difference between excessive reflow observed under prior art conditions, and limited reflow observed under conditions according to the disclosure. The substrate 1 (normally consisting of a bulk substrate and a plurality of layers), and the resist lines 3 are indicated by the same numerals as in FIG. 2.

According to one embodiment, the method of the disclosure obtains a reduction of the LWR with at least 7% and a shrinkage between 0 and 10%, such as between 2% and 8%.

The plasma-resist treatment is followed by one or more etching processes for transferring the resist patterns into the substrate material. The preferred etching method is Reactive Ion Etching, e.g., plasma etching. The pattern transfer may be done in the same reactor as the plasma treatment. The transfer may also take place at temperatures lower than zero degrees Celsius, such as between zero and −110° C., or between −10° C. and −100° C. At temperatures below zero degrees, the etch resistance of the photoresist to RIE etching may generally increase. Therefore, the disclosure allows a more economic resist budget. The resist budget refers to the loss of resist material during plasma etching. For example, 10% resist budget refers to 10% loss from the initial deposited resist thickness. When the resist budget is lower, the initial thickness of the resist layer 2 in the lithography process can be chosen lower, because the resist is less quickly removed during the etch process. Furthermore, the disclosure allows broadening the process window toward stack definition and for further etching steps. The plasma composition used for RIE may contain one or more of the following components HBr, $CF_4$, $SF_6$, $O_2$ or other components known in the art for this purpose.

Experimental Results

Nine silicon wafers were provided as test samples. A PMMA based photo resist with a layer thickness of 60 nm was used. Pattern samples were generated with 30 nm wide resist lines and 30 nm wide spaces between two adjacent lines.

Figure 5:
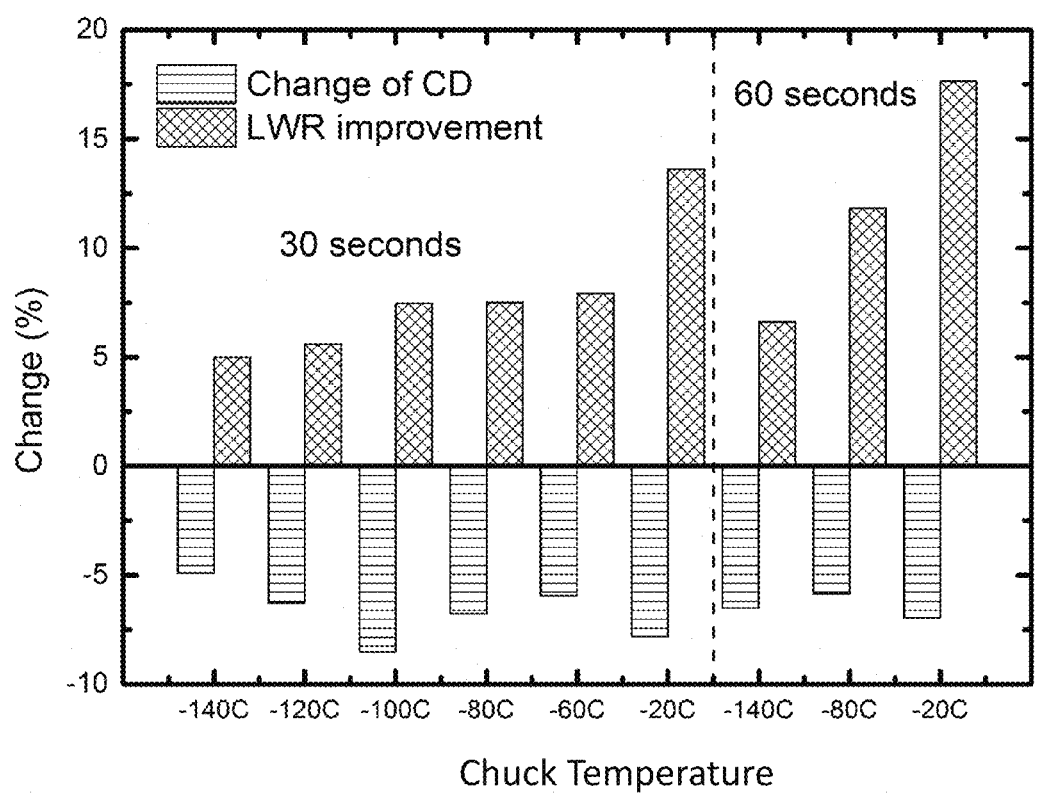
FIG. 5 is a graph diagram showing an overview of test results obtained by applying the method of the disclosure.

The samples were treated by $H_2$ plasma at temperatures of −20° C. down to −140° C., and with treatment durations of 30 s or 60 s, in an ICP reactor of the type shown in FIG. 3a. Parameters that were equal for all tested samples were: plasma power 300W, pressure 10 Torr, $H_2$ flow: 100 sccm, and distance $d_1$ about 20 cm. The results are illustrated in FIG. 5. All tested samples showed an improvement of LWR with a slight CD-shrinkage between 4% and 8%. The best result of 17.5% LWR reduction was achieved by a plasma treatment at -20° C. during 60 s. The temperature range of 0° C. to −110° C. was derived from the results. Lower than −110° C., LWR reduction became smaller than about 7%. At temperatures above 0° C., it is expected that the known effects at room temperature will start to become manifest, e.g., high LWR reduction but also loss of control over CD. LWR reduction at a 60 s treatment time was slightly better than at 30 s. Longer treatment times than 30 s may therefore provide benefits. The results show that the low temperature approach is valid in obtaining an improvement of LWR while controlling the CD.

While the disclosure has been illustrated and described in detail in the drawings and foregoing description, such illustration and description are to be considered illustrative or by way of example and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being present, deposited or produced 'on' another layer or substrate, includes the options of the layer being present, produced or deposited directly on, e.g., in physical contact with, the other layer or substrate, and the layer being present, produced or deposited on one or a stack of intermediate layers between the layer and the other layer or substrate.

The invention claimed is:

1. A method for treating a photoresist structure on a substrate, the method comprising:
    producing one or more resist structures on a substrate;
    introducing the substrate in a plasma reactor; and
    subjecting the substrate to a plasma treatment at a temperature of zero degrees Celsius or lower, and for a duration between 60 s and 180 s, to thereby limit reflow of the one or more resist structures and to limit shrinkage of a critical dimension of the one or more resist structures to between 0% and 10%.

2. The method according to claim 1, wherein the one or more resist structures are formed from a high resolution photoresist.

3. The method according to claim 1, wherein the photoresist structure comprises a polymer backbone structure with or without functional groups.

4. The method according to claim 1, wherein the one or more resist structures are parallel resist lines, and wherein the critical dimension of the lines is lower than or equal to 30nm.

5. The method according to claim 1, wherein the plasma treatment consists of an $H_2$ plasma treatment.

6. The method according to claim 1, wherein the plasma treatment takes place at a temperature between zero degrees Celsius and −110° C.

7. The method according to claim 6, wherein the plasma treatment takes place at a temperature between −10° C. and −100° C.

8. The method according to claim 1, wherein the substrate includes a semiconductor wafer or at least a semiconductor layer.

9. The method according to claim 1, wherein the plasma treatment is followed by a plasma etching process that uses the one or more resist structures as a mask.

10. The method according to claim 1, wherein the substrate is cooled to the temperature of zero degrees Celsius or lower, and is mounted on a cooled substrate chuck.

11. The method according to claim 1, wherein the plasma reactor is an inductively coupled plasma reactor comprising a cylindrical coil, and wherein subjecting the substrate to the plasma treatment includes producing plasma in an area substantially defined by an interior of the coil.

12. The method according to claim 11, wherein subjecting the substrate to the plasma treatment includes producing the plasma in the area substantially defined by the interior of the coil, such that a distance ($d_1$) between a core of the plasma and an upper surface of the substrate is between 15 cm and 25 cm.

13. The method according to claim 1, wherein the plasma reactor is a Transformer Coupled Plasma reactor comprising a planar coil and a reaction window, and wherein plasma is produced in an area between the reaction window and an upper surface of the substrate.

14. The method according to claim 1, wherein the plasma treatment produces a reduction of a Line Width Roughness of at least 7%.

15. The method according to claim 1, wherein the plasma treatment limits shrinkage of the critical dimension of the one or more resist structures to between 2% and 8%, and produces a reduction of the Line Width Roughness of at least 7%.

16. The method according to claim 1, wherein the one or more resist structures are formed from a high resolution photoresist, and wherein subjecting the substrate to a plasma treatment at a temperature of zero degrees Celsius or lower thereby limits reflow to substantially a layer at a surface of the one or more resist structures.

17. The method according to claim 1, wherein the plasma treatment takes place at a temperature between −10° C. and −110° C., and wherein the pressure during the plasma treatment is between 2 mTorr and 50 mTorr.

\* \* \* \* \*